United States Patent
Gregoire et al.

(10) Patent No.: US 12,050,233 B1
(45) Date of Patent: Jul. 30, 2024

(54) OPTICALLY LEVITATED NANOPARTICLE ACCELEROMETER

(71) Applicants: Government of the United States, as represented by the Secretary of the Air Force, Kirtland AFB, NM (US); Utah State University Space Dynamics Laboratory, North Logan, UT (US)

(72) Inventors: Maxwell D. Gregoire, Albuquerque, NM (US); Sean P. Krzyzewski, Albuquerque, NM (US); Brian L. Kasch, Albuquerque, NM (US); Charles W. Lewandowski, Albuquerque, NM (US)

(73) Assignees: Government of the United States, as represented by the Secretary of the Air Force, Washington, DC (US); Utah State University Space Dynamics Laboratory, North Logan, UT (US)

( * ) Notice: Subject to any disclaimer, the term of this patent is extended or adjusted under 35 U.S.C. 154(b) by 486 days.

(21) Appl. No.: 17/368,433

(22) Filed: Jul. 6, 2021

Related U.S. Application Data

(63) Continuation-in-part of application No. 16/268,271, filed on Feb. 5, 2019, now Pat. No. 11,085,944.
(Continued)

(51) Int. Cl.
- *G01P 15/093* (2006.01)
- *H03B 17/00* (2006.01)
- *H03L 7/26* (2006.01)

(52) U.S. Cl.
CPC ............ *G01P 15/093* (2013.01); *H03B 17/00* (2013.01); *H03L 7/26* (2013.01)

(58) Field of Classification Search
CPC ...... G01P 1/07; G01P 1/12; G01P 3/36; G01P 15/093; H03L 7/26; H03B 17/00
See application file for complete search history.

(56) References Cited

U.S. PATENT DOCUMENTS

| | | |
|---|---|---|
| 3,808,550 A | 4/1974 | Ashkin |
| 10,199,560 B2 | 2/2019 | Sirbuly et al. |
| 2004/0239937 A1 | 12/2004 | Post et al. |

OTHER PUBLICATIONS

"Behavior Analysis of a Gaussian Beam Optical Trap in the Rayleigh Regime," Khan, et al. Conference paper, available at: https://www.researchgate.net/publication/260600481_Behavior_Analysis_of_a_Gaussian_Beam_Optical_Trap_in_the_Rayleigh_Regime (Year: 2012).*

(Continued)

*Primary Examiner* — Benjamin R Schmitt
(74) *Attorney, Agent, or Firm* — Rahman LLC; David L. Narciso; Dale E. Andersen, Jr.

(57) ABSTRACT

An accelerometer includes a vacuum chamber to receive one or more pairs of laser beams and a nanoparticle. Each laser beam includes an axis and a focus having three dimensions. The nanoparticle is trapped in an oscillating state in a substantially overlapping three-dimensional foci of the one or more pairs of laser beams. A processor calculates an acceleration of the nanoparticle based on changes in position of the oscillating nanoparticle. At least one photodetector identifies spatial coordinates of the oscillating nanoparticle. The at least one photodetector includes a plurality of photodetectors that are aligned to sense interference between light from a first laser beam and light from the first laser beam that is scattered by the oscillating nanoparticle. The one or more pairs of laser beams may be collinear. The one or more pairs of laser beams may be configured to point at each other.

20 Claims, 10 Drawing Sheets

Related U.S. Application Data

(60) Provisional application No. 62/652,814, filed on Apr. 4, 2018.

(56) References Cited

OTHER PUBLICATIONS

Yin, Z., et al., "Optomechanics of Levitated Dielectric Particles," Int. J. Mod. Phys. B 27, Aug. 22, 2013, pp. 1-16.
Li, T., et al., "Measurement of the Instantaneous Velocity of a Brownian Particle," Science, vol. 328, Jun. 25, 2010, pp. 1673-1675.
Gieseler, J.,et. al., "Subkelvin parametric feedback cooling of a laser-trapped nanoparticle," Phys. Rev. Lett. 109, 103603-1 to 103603-5 with Supplementary Information S1-S10, Sep. 7, 2012.
Ranjit, G., et al., "Zeptonewton force sensing with nanospheres in an optical lattice," Phys. Rev. A 93, Mar. 10, 2016, pp. 1-5.
Monteiro, F., et al., "Optical levitation of 10 nanogram spheres with nano-g acceleration sensitivity," Phys. Rev. A 96, 063841, Nov. 13, 2017, pp. 1-7.
Butts, D., "Development of a Light Force Accelerometer," Ph.D. thesis, Massachusetts Institute of Technology, May 2008, 96 pages.
Ashkin, A., et al., "Optical levitation in high vacuum," Appl. Phys. Lett. Vol. 28, No. 6, Mar. 15, 1976, pp. 333-335.
Ranjit, G., et al., "Attonewton force detection using microspheres in a dual-beam optical trap in high vacuum," Phys. Rev. A 91, 051805(R), May 26, 2015, pp. 1-5.
Moore, D., et al., "Search for Millicharged Particles Using Optically Levitated Microspheres," Physical Review Letters, vol. 113, 251801, Dec. 19, 2014, pp. 1-5.
Hempston, D., et al., "Force sensing with an optically levitated charged nanoparticle," Appl. Phys. Lett. Vol. 111, 133111, Sep. 28, 2017, pp. 1-4.
Delić, U., et al., "Cavity Cooling of a Levitated Nanosphere by Coherent Scattering," Physical Review Letters, vol. 122, 123602, Mar. 27, 2019, pp. 1-6.
Windey, D., et al., "Cavity-Based 3D Cooling of a Levitated Nanoparticle via Coherent Scattering," Physical Review Letters, vol. 122, 123601, Mar. 27, 2019, pp. 1-5.
Frimmer, M., et al., "Controlling the net charge on a nanoparticle optically levitated in vacuum," Physical Review A, vol. 95, 061801(R), Jun. 6, 2017, pp. 1-4.
Caldani, R., et al., "A prototype industrial laser system for cold atom inertial sensing in space," Eur. Phys. J.D., vol. 73, 248, Dec. 5, 2019, pp. 1-9.
Kotru, K., "Toward a Demonstration of a Light Force Accelerometer," Master of Science Dissertation, Massachusetts Institute of Technology, Sep. 2010, pp. 1-81.

\* cited by examiner

FIG. 7B

150 → 160 — Selectively adjusting a precision and dynamic range of the accelerometer in real-time during operation of the accelerometer → A

FIG. 7C

150 → 162 — B → Adjusting a power of the overlapping pair of laser beams → C, D

150 ⟶ 164 — Increasing the power of the pair of laser beams to increase an electric field density in the foci of the overlapping pair of laser beams in the trap region to increase a confinement of the nanoparticle in the trap region 150 ⟶ 166 — Reducing the power of the pair of laser beams to increase sensitivity of the accelerometer to measure accelerations of the nanoparticle

OPTICALLY LEVITATED NANOPARTICLE ACCELEROMETER

CROSS-REFERENCE TO RELATED APPLICATION(S)

This application is a Continuation-In-Part of U.S. patent application Ser. No. 16/268,271 filed on Feb. 5, 2019, which claims the benefit of U.S. Provisional Patent Application No. 62/652,814 filed on Apr. 4, 2018, the entire contents of which, in their entireties, are herein incorporated by reference.

GOVERNMENT INTEREST

The invention described herein may be manufactured and used by or for the Government of the United States for all government purposes without the payment of any royalty.

BACKGROUND

Field of the Invention

The embodiments herein generally relate to optomechanics, and more particularly to techniques for capturing and measuring properties of optically levitated nanoparticles.

Background of the Invention

The use of optically levitated nanoparticles as force sensors has been the subject of academic research for the past 10 years. However, that research is generally limited to cases in which levitated nanoparticles are used as mechanical resonators. Developing the next generation of portable, high-precision accelerometers is currently a sought-after goal in industry. Portable, high-precision accelerometers and gyroscopes are a key component in defense systems such as guided missiles, particularly those designed to intercept fast-moving targets. They also provide an important alternative to GPS navigation for all types of craft in space, land, air, and sea. Accelerometers may be used with relative accuracy for motion sensing to detect and measure acceleration, angular velocity, etc. of devices in motion including relatively small devices such as smartphones. These measurements can identify the location or movement of the device. However, as devices decrease in size, the sensitivity of measuring the acceleration, etc. tends to decrease resulting in reduced accuracy.

Furthermore, an accelerometer measures the displacement of a test mass, whether an atom, nanoparticle, or macroscopic object, with respect to the apparatus as a function of acceleration experienced by the apparatus. In such devices, there will always be a limit to how far the mass m can displace without breaking the device or critically reducing precision, which sets an upper limit on the accelerations the device can measure (called the dynamic range). In many architectures, this problem is addressed by confining the mass with a restoring force (expressed as spring constant k), such as an optical or electromagnetic trap or a physical spring. However, while a more tightly confined mass can survive higher accelerations, it displaces less as a function of applied acceleration, reducing sensitivity to that acceleration. This conflict between precision and dynamic range works to the detriment of real-world applications because m and k are fixed values: when a new accelerometer is designed for a vehicle, its m and k are chosen such that it will withstand the highest accelerations that the vehicle might reasonably experience. Then, while operating, its precision will be suboptimal in literally every situation except the most extreme ones. This is a problem for applications in which high-precision measurements of acceleration are needed for a wide range of accelerations values, such as highly-maneuverable space vehicles. Therefore, a motion sensor that is adaptable for small and large-size devices is preferred particularly for applications involving high-precision motion and location detection requirements.

BRIEF SUMMARY OF THE INVENTION

In view of the foregoing, an embodiment herein provides an accelerometer comprising a vacuum chamber to receive one or more pairs of laser beams and a nanoparticle, wherein each laser beam comprises an axis and a focus having three dimensions, and wherein the nanoparticle is trapped in an oscillating state in a substantially overlapping three-dimensional foci of the one or more pairs of laser beams; a processor to calculate an acceleration of the nanoparticle based on changes in position of the oscillating nanoparticle; and at least one photodetector to identify spatial coordinates of the oscillating nanoparticle. The at least one photodetector may comprise a plurality of photodetectors that are aligned to sense interference between light from a first laser beam and light from the first laser beam that is scattered by the oscillating nanoparticle. The one or more pairs of laser beams may be collinear. The one or more pairs of laser beams may be configured to point at each other.

The nanoparticle may comprise a diameter of a predetermined size and is trapped in the focus of the laser beam based on a polarizability of the nanoparticle, and wherein the substantially overlapping foci comprise a trap region having a first electric field density $E1$ provided by the first laser greater than a second electric field density $E2$ in areas outside the trap region. The one or more pairs of laser beams may comprise substantially similar power levels and waist diameters. The net radiation pressure force on the oscillating nanoparticle does not exceed a net trapping force applied to the oscillating nanoparticle.

Another embodiment provides a system comprising a plurality of laser sources to generate a plurality of laser beams; a vacuum chamber comprising a levitating nanoparticle oscillating in overlapping foci of the plurality of laser beams, wherein the nanoparticle scatters light; at least one sensor to detect a position of the nanoparticle by sensing an interference between light from the laser beam and the light scattered by the nanoparticle; and a processor to determine an acceleration of the nanoparticle based on a displacement in the position of the nanoparticle and a frequency of oscillation of the nanoparticle while the nanoparticle is oscillating in the overlapping foci of the plurality of laser beams. The at least one sensor may comprise an array of photodiode sensors to monitor the scattered light emitting from the nanoparticle and the light from the laser beam that is not scattered by the nanoparticle, and determine a three-dimensional motion of the nanoparticle while the nanoparticle is oscillating in the overlapping foci of the plurality of laser beams. The system may comprise a modulator to control an intensity of the plurality of laser beams. The plurality of laser sources may generate a set of two or more laser beams. The electric field density in the trap region may be greater than the electric field density in areas outside of the trap region in the vacuum chamber.

Another embodiment provides a method of measuring an acceleration of a nanoparticle, the method comprising focusing a pair of overlapping laser beams each having an axis in an accelerometer to define a three-dimensional trap region in the accelerometer; introducing a nanoparticle into the trap region such that the nanoparticle oscillates within the trap region; detecting positions of the nanoparticle as the nanoparticle oscillates in the trap region using a plurality of photodetectors that are spaced apart; and measuring an acceleration of the nanoparticle based on the detected positions and a frequency of oscillation of the nanoparticle.

The method may comprise selectively adjusting a precision and dynamic range of the accelerometer in real-time during operation of the accelerometer. The method may comprise adjusting a power of the overlapping pair of laser beams. The method may comprise increasing the power of the pair of laser beams to increase an electric field density in the foci of the overlapping pair of laser beams in the trap region to increase a confinement of the nanoparticle in the trap region. The method may comprise reducing the power of the pair of laser beams to increase sensitivity of the accelerometer to measure accelerations of the nanoparticle. The method may comprise adjusting a waist diameter of the overlapping pair of laser beams in the trap region. The method may comprise reducing the waist diameter to increase a light intensity of the overlapping pair of laser beams in the trap region and to increase an electric field density in the foci of the overlapping pair of laser beams in the trap region. The measuring of the acceleration of the nanoparticle based on the detected positions and the frequency of oscillation may comprise measuring a center of the nanoparticle with respect to a center of the trap region.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which:

FIG. 7B is a flow diagram illustrating a method of conducting real-time operation of an accelerometer, according to an embodiment herein;

FIG. 7C is a flow diagram illustrating a method of controlling a pair of laser beams, according to an embodiment herein;

DETAILED DESCRIPTION OF THE INVENTION

Figure 1:
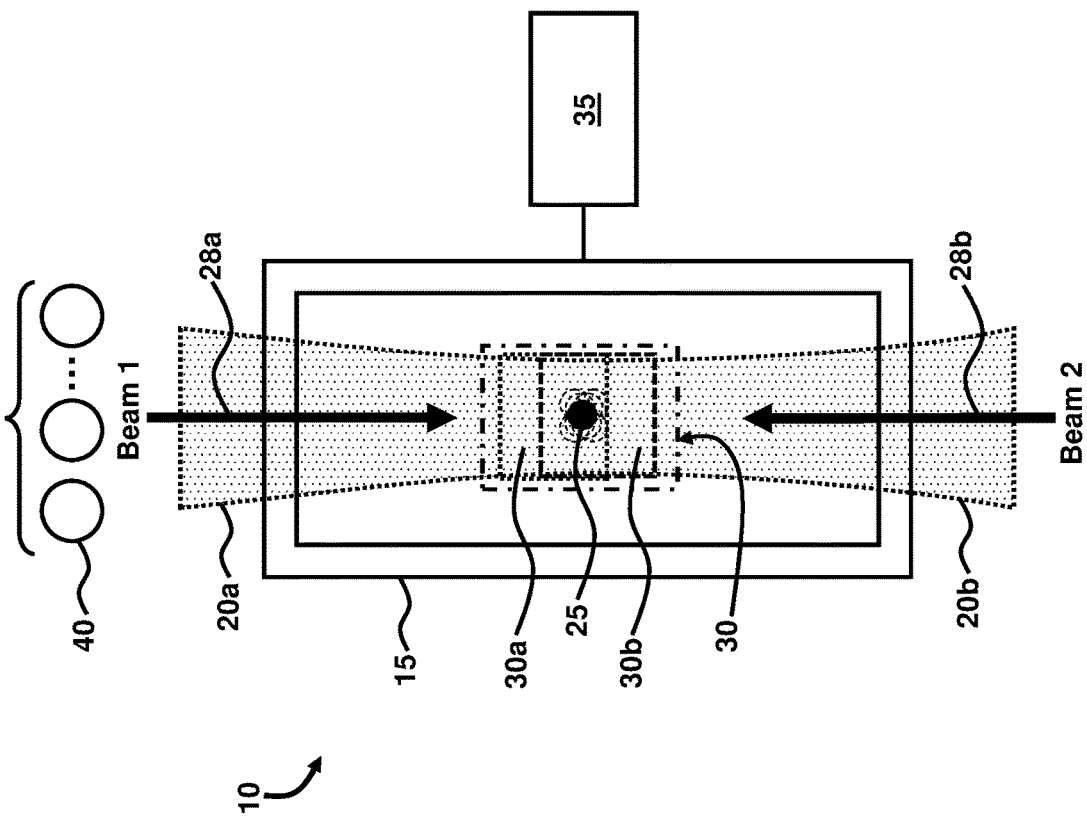
FIG. 1 is a schematic block diagram illustrating an accelerometer to calculate an acceleration of a nanoparticle, according to an embodiment herein.

Embodiments of the disclosed invention, its various features and the advantageous details thereof, are explained more fully with reference to the non-limiting embodiments that are illustrated in the accompanying drawings and detailed in the following description. Descriptions of well-known components and processing techniques are omitted to not unnecessarily obscure what is being disclosed. Examples may be provided and when so provided are intended merely to facilitate an understanding of the ways in which the invention may be practiced and to further enable those of skill in the art to practice its various embodiments. Accordingly, examples should not be construed as limiting the scope of what is disclosed and otherwise claimed.

The embodiments herein utilize optically levitated nanoparticles for inertial sensing to continuously and directly measure inertial and gravitational forces. An example provides an accelerometer that measures acceleration by observing the displacement and the frequency of oscillation of a nanoparticle within a trap comprising a focused laser beam that suspends or traps the nanoparticle in a vacuum chamber. When the trapping apparatus is accelerated, the nanoparticle displaces within the trap due to its own inertia. The nanoparticle may be introduced into the vacuum chamber using different techniques including an aerosol spray containing the nanoparticle, launching the nanoparticle in a buffered/inert gas such as $N_2Ar$, or launching the nanoparticle from a vibrating glass slide. The oscillation of the nanoparticle in the vacuum chamber may be controlled using a "cooling" technique, which involves modulating the power of the laser beam to retain the nanoparticle within the trap region of the vacuum chamber.

For the nanoparticle to be able to be trapped, the particle radius and beam waist diameter must not exceed certain maximums. The reason for this lies in the fact that the nanoparticle is affected by two different forces while in the focus of the laser. The first force, called electric dipole attraction, is due to the interaction between the electric fields that make up the laser beam and the polarizable matter that makes up the particle. This force pulls the particle toward regions of higher electric-field density (i.e., the center of the laser beam) and attempts to "trap" the particle there. The second force, called radiation pressure, is the force on the particle due to the photons (light particles) that make up the laser beam repeatedly hitting the particle from the same direction. This force attempts to push the particle in the direction of the laser light away from the trap, ultimately opposing the trapping force. If the particle becomes too large or the laser waist diameter becomes too wide, the repulsive radiation pressure force overwhelms the attractive electric dipole force, and the particle cannot be trapped.

According to the embodiments herein, the nanoparticle is trapped using at least two counter-propagating (i.e., collinear and pointing at each other) laser beams with mostly-overlapping foci, similar power, and similar waist diameters. The radiation pressure forces of each of the two lasers beams are equal and opposite and, therefore, largely cancel each other out, making it so the nanoparticle is only affected by the trapping force. This allows one to trap larger nanoparticles using larger laser waist diameters than what could be accomplished with a single beam. More generally, this type of trapping could be accomplished with any set of two or more lasers for which the net radiation pressure force on the particle does not exceed the net trapping force.

Referring now to the drawings, and more particularly to FIGS. 1 through 7G, where similar reference characters denote corresponding features consistently throughout, there are shown exemplary embodiments. In the drawings, the size and relative sizes of components, layers, and regions may be exaggerated for clarity.

FIG. 1 illustrates an accelerometer 10 comprising a vacuum chamber 15 to receive one or more pairs of laser beams 20a, 20b and a nanoparticle 25. Each laser beam 20a or 20b comprises an axis 28a, 28b and a focus 30a, 30b having three dimensions. According to some examples, the one or more pairs of laser beams 20a, 20b may be collinear, and the one or more pairs of laser beams 20a, 20b may be configured to point at each other. The nanoparticle 25 is trapped in an oscillating state in a substantially overlapping three-dimensional foci 30 of the one or more pairs of laser beams 20a, 20b. According to some examples, each laser beam 20a, 20b may comprise any suitable wavelength of light such as 532 nm, 1064 nm, and 1550 nm, although other suitable wavelengths may be utilized in accordance with the embodiments herein. The nanoparticle may comprise various materials such as silica, silicon, or diamond, for example, and may have some non-zero polarizability and therefore is attracted to regions of higher electric field density; i.e., the center of the overlapping foci 30 of the laser beams 20a, 20b. Thus, the nanoparticle 25 is "levitated", or held in space by the laser beams 20a, 20b. As such, the laser beams 20a, 20b are focused to a point in space; e.g., the overlapping foci 30, in the vacuum chamber 15 in order to levitate the nanoparticle 25. Accordingly, the overlapping foci 30 may be considered as an optical dipole trap for holding the suspended nanoparticle 25. The nanoparticle 25 may be trapped by the pair of laser beams 20a, 20b regardless of the gravitational field. Because the nanoparticle 25 is smaller than the wavelength of light, it does not reflect light like microspheres, and instead the nanoparticle 25 is attracted to the overlapping foci 30 of the laser beams 20a, 20b by virtue of the polarizability of the nanoparticle 25. Furthermore, the vacuum chamber 15 is not restricted to a high vacuum environment so long as the nanoparticle 25 is not disturbed by collisions with air molecules.

A processor 35 is provided to calculate an acceleration of the nanoparticle 25 based on changes in position of an oscillating nanoparticle 25. In an example, the position of the nanoparticle 25 within the trap; e.g., the overlapping foci 30 of the laser beams 20a, 20b, can be continuously monitored using image detection and processing techniques, which are further described below. Moreover, the nanoparticle 25 constantly scatters light from the trapping laser beams 20a, 20b in the form of spherical waves; i.e., photons traveling away from the nanoparticle 25 in random directions.

In some examples, the processor 35 described herein and/or illustrated in the figures may include hardware-enabled modules and may include a plurality of overlapping or independent electronic circuits, devices, and discrete elements packaged onto a circuit board to provide data and signal processing functionality within a computer. An example might be a comparator, inverter, or flip-flop, which could include a plurality of transistors and other supporting devices and circuit elements. The modules that include electronic circuits may process computer logic instructions capable of providing digital and/or analog signals for performing various functions as described herein. The various functions can further be physically saved as any of data structures, data paths, data objects, data object models, object files, and database components. For example, the data objects could include a digital packet of structured data. The data structures could include any of an array, tuple, map, union, variant, set, graph, tree, node, and an object, which may be stored and retrieved by computer memory and may be managed by processors, compilers, and other computer hardware components. The data paths may be part of a computer CPU that performs operations and calculations as instructed by the computer logic instructions. The data paths could include digital electronic circuits, multipliers, registers, and buses capable of performing data processing operations and arithmetic operations (e.g., Add, Subtract, etc.), bitwise logical operations (AND, OR, XOR, etc.), bit shift operations (e.g., arithmetic, logical, rotate, etc.), and complex operations (e.g., using single clock calculations, sequential calculations, iterative calculations, etc.). The data objects may be physical locations in computer memory and can be a variable data object, a data structure, or a function. In an example of a relational database, the data objects can be set as a table or column. Other implementations include specialized objects, distributed objects, object-oriented programming objects, and semantic web objects, for example. Furthermore, the data object models can be set as an application programming interface for creating HyperText Markup Language (HTML) and Extensible Markup Language (XML) electronic documents. The models can be further set as any of a tree, graph, container, list, map, queue, set, stack, and variations thereof, according to various examples. The data object files may be created by compilers and assemblers and may contain generated binary code and data for a source file. The database components can include any of tables, indexes, views, stored procedures, and triggers.

Furthermore, the processor 35 may comprise any of an integrated circuit, an application specific integrated circuit (ASIC), field-programmable gate array (FPGA), and a microcontroller according to exemplary embodiments. In some examples, the processor 35 may comprise a central processing unit (CPU) of an associated computing device, not shown. In other examples the processor 35 may be a discrete component independent of other processing components in the associated computing device. In other examples, the processor may be a microprocessor, microcontroller, hardware engine, hardware pipeline, and/or other hardware-enabled device suitable for receiving, processing, operating, and performing various functions required by the associated computing device. The processor 35 may be provided in the associated computing device, coupled to the associated computing device, or communicatively linked to the associated computing device from a remote networked location, according to various examples.

The accelerometer 10 may be used by itself for inertial sensing, however an array of accelerometers 10 positioned at known distances from one another could form a gravity gradiometer, which may be used in navigation to detect the direction of gravitational attraction to the Earth. Other uses for the high-sensitivity accelerometer 10 include monitoring the motion of the Earth and its tectonic plates, prospecting for oil and minerals, detecting tunnels underground, and monitoring the motion of people or objects behind barriers.

The accelerometer 10 may further comprise at least one photodetector 40 that are spaced apart to identify spatial coordinates x, y, z of the oscillating nanoparticle 25. Moreover, the at least one photodetector 40 may comprise a plurality of photodetectors 40x that are aligned to sense interference between light from a first laser beam 20a or 20b and light from the first laser beam 20a or 20b that is scattered by the oscillating nanoparticle 25. The plurality of photodetectors 40x may be positioned within the trapping laser beams 20a, 20b to measure the sum of the scattered and non-scattered light, which depends on the relative phases of the two. The phase of the non-scattered light is nominally constant, while the phase of the scattered light depends on the position of the nanoparticle 25. Therefore, by measuring the relative phase of the two signals, the plurality of photodetectors 40x constantly measures the distance between itself and the nanoparticle 25. Accordingly, an array of the plurality of photodetectors 40x at different positions can track the motion of the nanoparticle in three-dimensions and remove errors associated with fluctuations in the non-scattered light phase.

Figure 2:
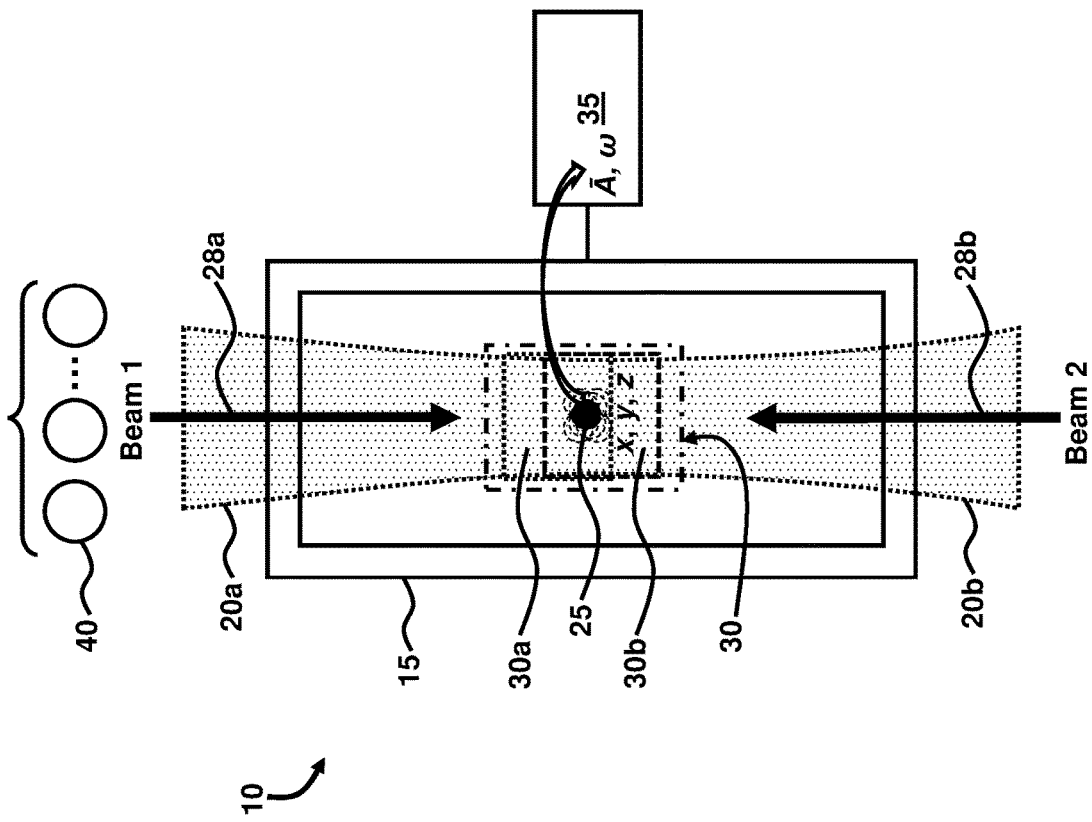
FIG. 2 is a schematic block diagram illustrating a technique for calculating the acceleration of a nanoparticle in the accelerometer of FIG. 1, according to an embodiment herein.

FIG. 2, with reference to FIG. 1, illustrates that the processor 35 may calculate the acceleration $\overline{A}$ of the nanoparticle 25 based on changes in the spatial coordinates x, y, z of the oscillating nanoparticle 25 and a frequency @ of oscillation of the nanoparticle 25 within the vacuum chamber 15. The levitated nanoparticle 25 is constantly subjected to motional cooling. There are many effects which may cause the nanoparticle 25 to gain motional energy and, if left unchecked, oscillate with greater amplitude within the overlapping foci 30 of the laser beams 20a, 20b such as vibrational motion of the laser beams 20a, 20b, fluctuations in the intensity of the laser beams 20a, 20b, collisions between the nanoparticle and background gas within the vacuum chamber 15, and the momentum kicks associated with the absorption and re-emission of photons of the nanoparticle 25 from the trapping laser beams 20a, 20b, among other effects, according to some examples. Therefore, the oscillation of the nanoparticle 25 is damped. One way to accomplish this is using Sisyphus cooling, for example, which is a type of laser cooling involving shining interfering laser beams on an atom sample. When the nanoparticle 25 moves toward its center of oscillation, the strength of the overlapping foci 30 of the laser beams 20a, 20b is decreased. This causes the nanoparticle 25 to gain less kinetic energy traveling toward its center of oscillation then it spent moving away from its center of oscillation. Thus, the nanoparticle 25 constantly loses motional energy. Eventually, some energy equilibrium is reached that depends on the characteristics of the heating effects and, in very low-energy cases, quantum mechanical limitations.

Figure 3:
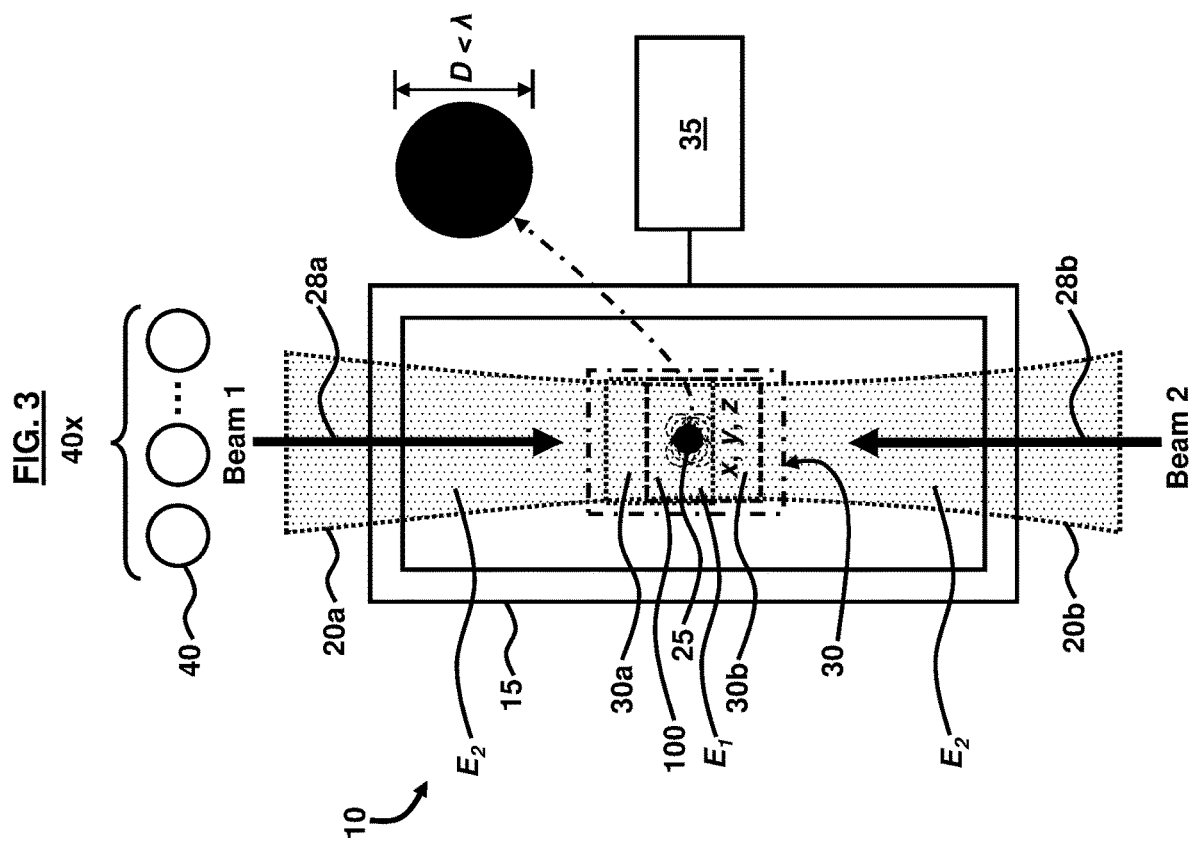
FIG. 3 is a schematic block diagram illustrating aspects of the nanoparticle in the accelerometer of FIG. 1, according to an embodiment herein.

FIG. 3, with reference to FIGS. 1 and 2, illustrates that the nanoparticle 25 may comprise a diameter D of a predetermined size and is trapped in the focus 30a, 30b of the laser beam 20a or 20b based on a polarizability of the nanoparticle 25. The substantially overlapping foci 30 comprise a trap region 100 having a first electric field density $E_1$ provided by the laser beams 20a, 20b greater than a second electric field density $E_2$ in areas outside the trap region 100. In an example, the nanoparticle 25 may be a sub-wavelength-sized particle, although any suitably-sized diameter D of the nanoparticle 25 may be used in accordance with the embodiments herein. The diameter D of the predetermined size of the nanoparticle 25 may be smaller than a wavelength $\lambda$ of the laser beams 20a, 20b. For example, the diameter D of the nanoparticle 25 may be smaller than the chosen wavelength $\lambda$ of the laser beams 20a, 20b; for example, around 100-200 nm. The one or more pairs of laser beams 20a, 20b may comprise substantially similar power levels and waist diameters. Moreover, the net radiation pressure force on the oscillating nanoparticle 25 does not exceed a net trapping force applied to the oscillating nanoparticle 25, according to an example.

Figure 4:
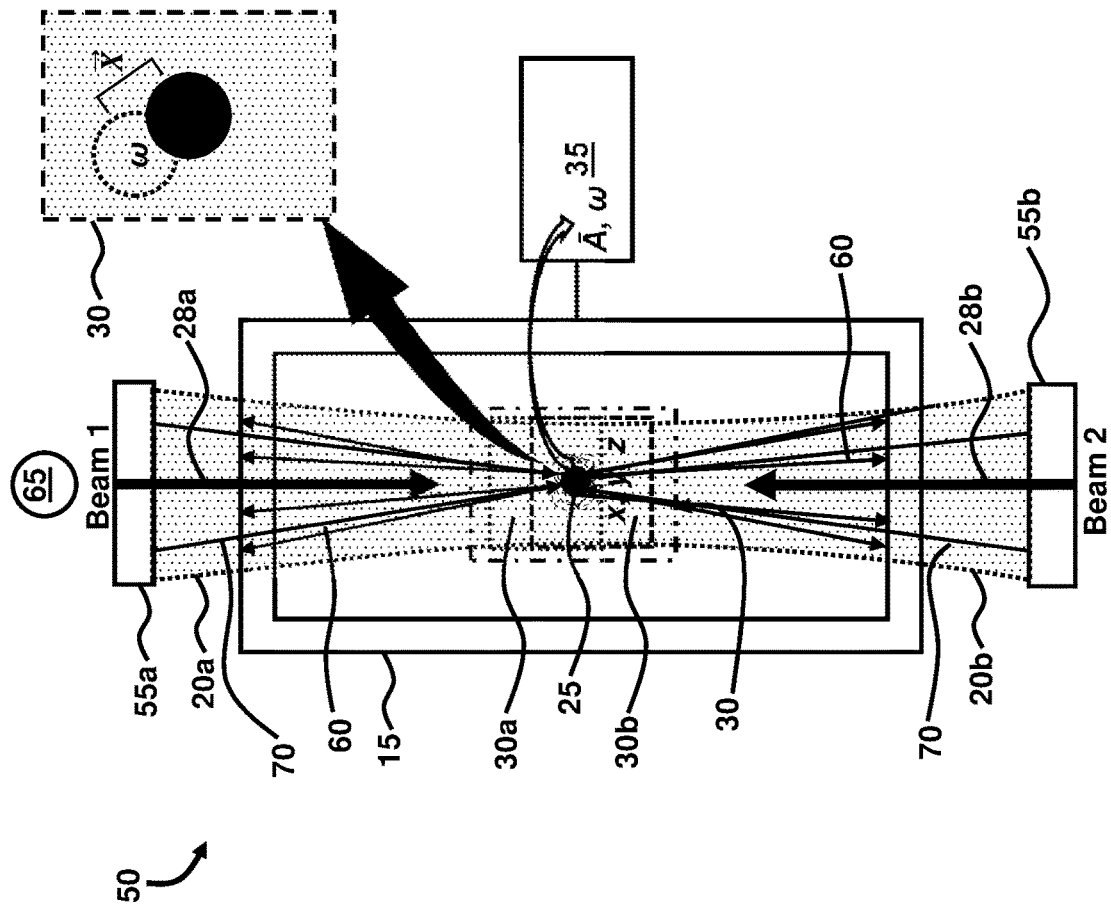
FIG. 4 is a schematic block diagram illustrating a system to determine an acceleration of a nanoparticle, according to an embodiment herein.

FIG. 4, with reference to FIGS. 1 through 3, illustrates a system 50 comprising a plurality of laser sources 55a, 55b to generate a plurality of laser beams 20a, 20b. Furthermore, the plurality of laser sources 55a, 55b may generate a set of two or more laser beams 20a, 20b. A vacuum chamber 15 is provided comprising a levitating nanoparticle 25 oscillating in overlapping foci 30 of the plurality of laser beams 20a, 20b. The nanoparticle 25 scatters light 60. At least one sensor 65 is provided to detect a position of the nanoparticle 25 by sensing an interference between light 70 from the laser beams 20a, 20b and the light 60 scattered by the nanoparticle 25. A processor 35 is provided to determine an acceleration of the nanoparticle 25 based on a displacement $\vec{X}$ in the position of the nanoparticle 25 and a frequency $\omega$ of oscillation of the nanoparticle 25 while the nanoparticle 25 is oscillating in the overlapping foci 30 of the plurality of laser beams 20a, 20b.

As described above, according to some examples, the laser beams 20a, 20b may comprise any suitable wavelength of light such as 532 nm, 1064 nm, and 1550 nm, although other suitable wavelengths may be utilized in accordance with the embodiments herein. The nanoparticle 25 may comprise various materials such as silica, silicon, or diamond, for example, and may have some non-zero polarizability and therefore is attracted to regions of higher electric field density; i.e., the center of the overlapping foci 30 of the laser beams 20a, 20b. Thus, the nanoparticle 25 is "levitated", or held in space by the laser beams 20a, 20b. As such, the laser beams 20a, 20b is focused to a point in space; e.g., the overlapping foci 30, in the vacuum chamber 15 in order to levitate the nanoparticle 25. Accordingly, the overlapping foci 30 may be considered as an optical dipole trap for holding the suspended nanoparticle 25. The vacuum chamber 15 is not restricted to a high vacuum environment so long as the nanoparticle 25 is not disturbed by collisions with air molecules.

The trapping potential of the laser beams 20a, 20b appears approximately quadratic to the nanoparticle 25:

$$V_{trap} = \frac{1}{2}k|\vec{x}|^2 \qquad (1)$$

where k is the spring constant of the trap (e.g., overlapping foci 30 of the laser beams 20a, 20b), and $\vec{x}$ is the vector pointing from the center of the trap (e.g., overlapping foci 30 of the laser beams 20a, 20b) to the position of the nanoparticle 25. Equation (1) is approximately true so long as the position of the nanoparticle 25 obeys the following characteristics:

$$r < \frac{\omega_0}{4} \quad (2)$$

$$z < \frac{z_R}{4} \quad (3)$$

where r and z are the polar coordinates representing $\vec{x}$ (z is the coordinate along the axis 28a, 28b of each of the respective laser beams 20a, 20b), $\omega_0$ is the Gaussian beam waist, and $z_R$ is the Rayleigh range of each of the respective laser beams 20a, 20b.

An inertial or gravitational acceleration $\vec{a}$ can be expressed as a linear potential:

$$V_{accel} = -m\vec{a} \cdot \vec{x} \quad (4)$$

where m is the mass of the nanoparticle 25 (~$10^{-18}$ kg). The total potential affecting the nanoparticle 25 is $V = V_{trap} + V_{accel}$. The total force on the nanoparticle 25 is therefore expressed as:

$$\vec{F} = -\left(\frac{dV}{dx}\hat{x} + \frac{dV}{dy}\hat{y} + \frac{dV}{dz}\hat{z}\right) = -k\vec{x} + m\vec{a} \quad (5)$$

The center of the oscillation of the nanoparticle 25, $\vec{x}_0$, occurs at the $\vec{x}$ where $\vec{F}=0$. Therefore, the acceleration experienced by the nanoparticle 25 is proportional to the displacement of its center of oscillation from the center of the optical trap (e.g., overlapping foci 30 of the laser beams 20a, 20b):

$$\vec{a} = \frac{k}{m}\vec{x}_0 = \omega^2 \vec{x}_0 \quad (6)$$

where $\omega/(2\pi)$ is the frequency of oscillation of the nanoparticle 25.

Thus, the acceleration experienced by the nanoparticle 25 can be continuously measured by continuously measuring $\omega$ and $\vec{x}_0$. Moreover, $\vec{x}_0$ can be determined by finding the time average of $\vec{x}(t)$, and $\omega$ can be determined by finding peaks in the Fourier transform of $\vec{x}(t)$. Alternatively, $\omega$ and $\vec{x}_0$ can be determined simultaneously by fitting sine waves to the x, y, and z positions of the nanoparticle 25.

The sensitivity of an acceleration measurement is a measure of how precisely acceleration can be measured given a specified amount of data acquisition time. Acceleration sensitivity Sa is defined as $\sigma_a \sqrt{T}$, where $\sigma_a$ is the statistical error on a measurement and T is the time it took to make that measurement (lower values of Sa are better). It is known from Equation (6) that an uncertainty in $\vec{x}_0$ will yield an uncertainty in acceleration as provided by:

$$\sigma_{\vec{a}}^2 = \omega^2 \sigma_{\vec{x}_0}^2 \quad (7)$$

Each side of Equation (7) can be multiplied by $\sqrt{T}$ to yield the following expression:

$$S_{\vec{a}}^2 = \omega^2 S_{\vec{x}_0}^2 \quad (8)$$

Industry-reported position sensitivities $S_{\vec{x}_0}$, are on the order of $10^{-12}$ to $10^{-14}$ m/$\sqrt{\text{Hz}}$. It can be seen from Equation (8) that lower oscillation frequencies result in better acceleration sensitivities.

One aspect to this concept is that the acceleration can be computed entirely using quantities that are measured in real-time: $\omega$ and $\vec{x}_0$. Specifically, there are no quantities such as the mass of the nanoparticle 25 or the size of the optical trap (e.g., overlapping foci 30 of the laser beams 20a, 20b) which, if not known with high accuracy, would limit the overall accuracy of the accelerometer 10 or system 50.

Another aspect of the embodiments herein is that the sensitivity and dynamic range of the accelerometer 10 or system 50 can be tuned in real-time depending on the motion and sensitivity requirements of a particular device (e.g., a vehicle, machine, apparatus, etc.) to which the accelerometer 10 or system 50 could be attached. The dynamic range is the range of minimum to maximum accelerations that the attached device can measure. The frequency of oscillation, which is proportional to the sensitivity, is given by the following equation:

$$\omega^2 = \left(\frac{16\lambda^2 P}{\pi^2 c \rho \omega_0^6}\right)\left(\frac{n^2-1}{n^2+2}\right) \quad (9)$$

and that maximum detectable acceleration $a_{max}$ is equal to:

$$a_{max} = \left(\frac{4\lambda P}{\pi c \rho \omega_0^4}\right)\left(\frac{n^2-1}{n^2+2}\right) \quad (10)$$

where $\lambda$ is the wavelength of the laser light 70, P is the laser power, c is the speed of light, p is the density of the nanoparticle 25, and n is the index of refraction of the material that makes up the nanoparticle 25. These equations show that, by adjusting the laser power P and the Gaussian beam waist $\omega_0$ in real-time, one can select combinations of sensitivity and dynamic range that best suit the particular application for which the accelerometer 10 and/or system 50 are to be implemented.

Figure 5:
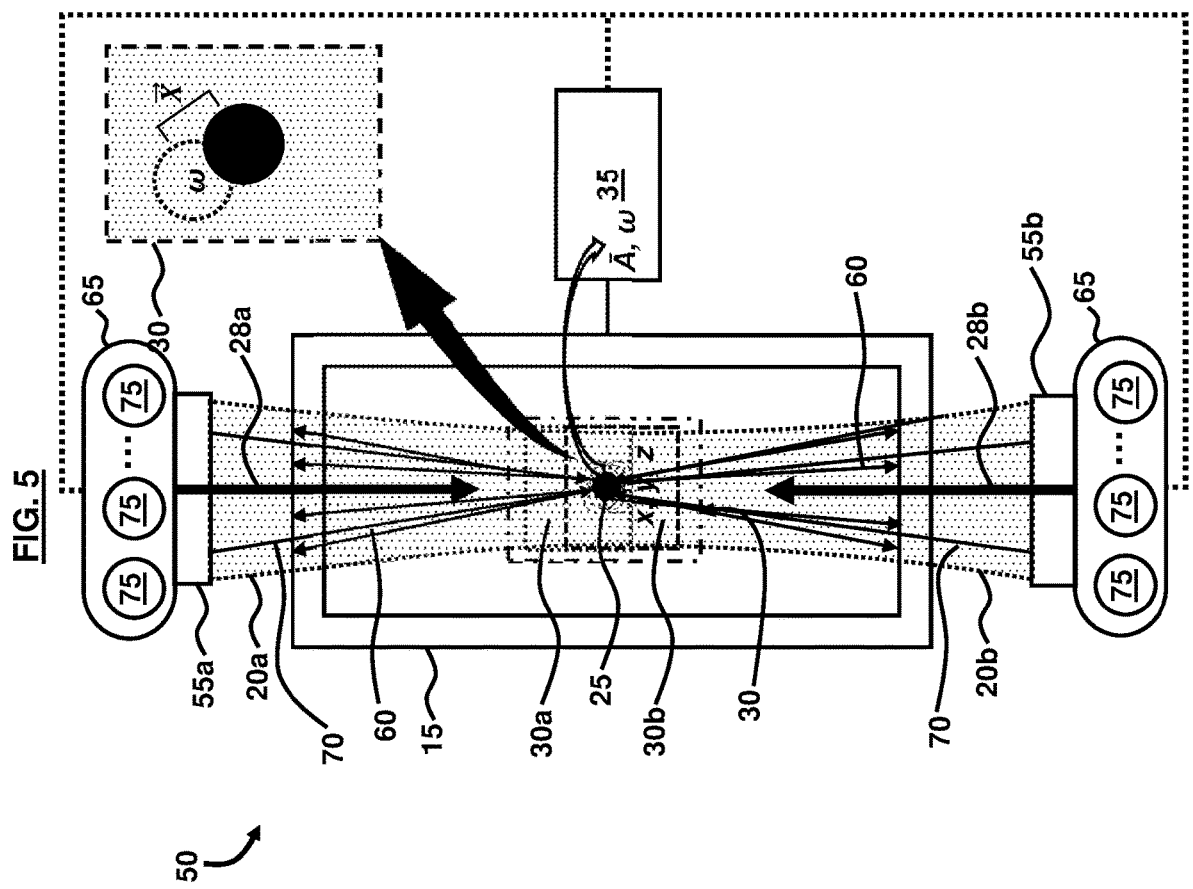
FIG. 5 is a schematic block diagram illustrating an array of photodiode sensor in the system of FIG. 4, according to an embodiment herein.

FIG. 5, with reference to FIGS. 1 through 4, illustrates that the at least one sensor 65 may comprise an array of photodiode sensors 75 to monitor the scattered light 60 emitting from the nanoparticle 25 and the light 70 from the laser beam 20a or 20b that is not scattered by the nanoparticle 25, and determine a three-dimensional motion of the nanoparticle 25 while the nanoparticle 25 is oscillating in the overlapping foci 30 of the plurality of laser beams 20a, 20b. The array of photodiode sensors 75 may comprise any suitable type of photodiode device or devices capable of monitoring the scattered light 60, and accordingly, the array of photodiode sensors 75 may be arranged in any suitable arrangement to properly detect and monitor the scattered light 60. In an example, the array of photodiode sensors 75 may be communicatively coupled to the processor 35 to provide real-time image processing of the scattered light 60 by the processor 35.

Figure 6:
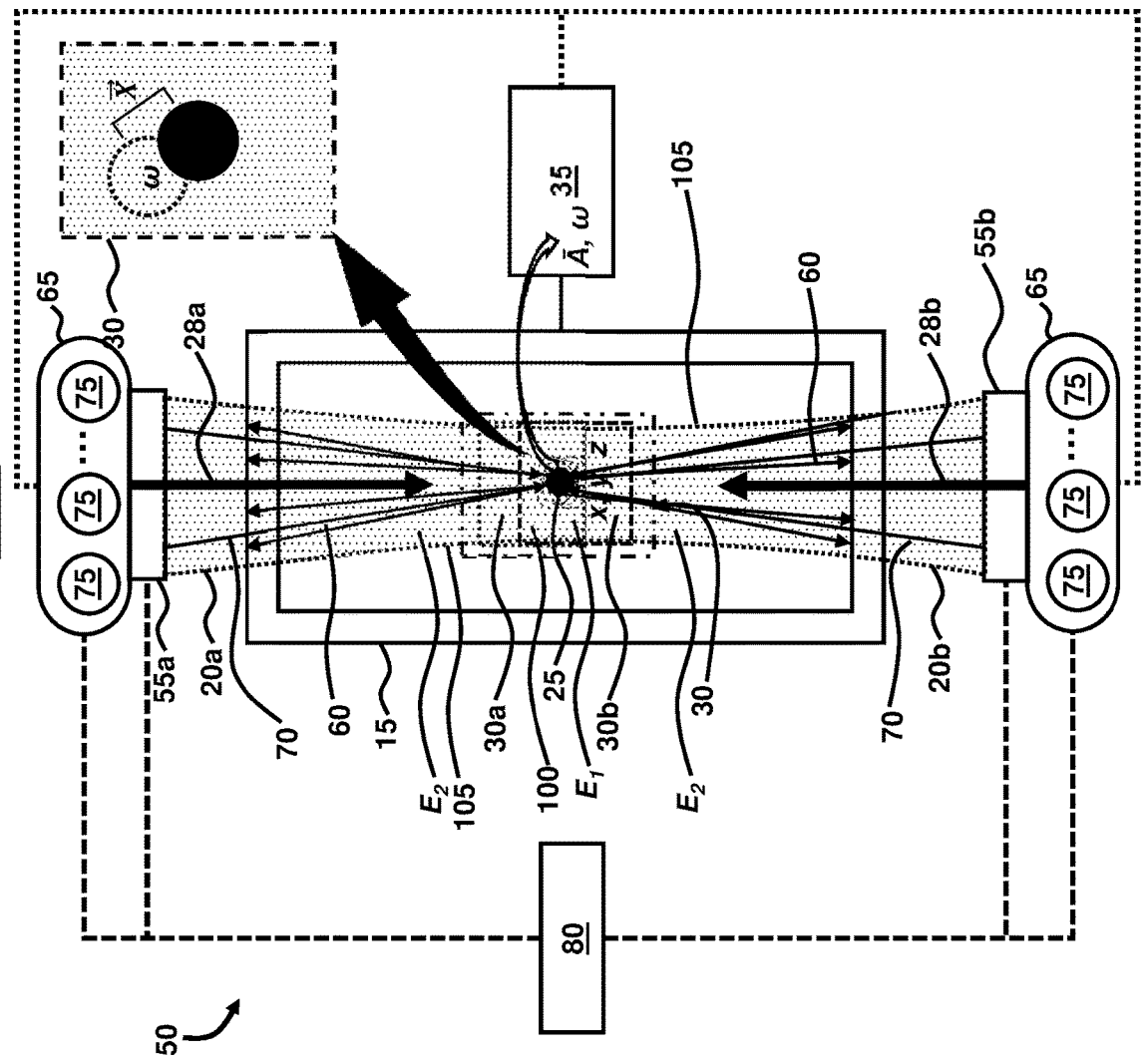
FIG. 6 is a schematic block diagram illustrating a modulator in the system of FIG. 4, according to an embodiment herein.

FIG. 6, with reference to FIGS. 1 through 5, illustrates that the system 50 may comprise a modulator 80 to control an intensity of the plurality of laser beams 20a, 20b. According to some examples, the modulator 80 may be a stand-alone device to modulate or control the intensity of the plurality of laser beams 20a, 20b, or the modulator 80 may be configured as part of the laser sources 55a, 55b emitting the plurality of laser beams 20a, 20b. Furthermore, the modulator 80 may provide for a "cooling" technique, as further described below, to help control the speed of the nanoparticle 25 upon entering the vacuum chamber 15. Furthermore, there may be more than one modulator 80 in the system 50.

An electric field density $E_1$ in the trap region 100 may be greater than the electric field density $E_2$ in areas 105 outside of the trap region 100 in the vacuum chamber 15. The embodiments herein are not restricted to any particular level for the electric field density $E_1$ and/or $E_2$, as the generated electric field density $E_1$ and/or $E_2$ may be dictated by various factors including the strength or intensity of the laser beams 20a, 20b, the speed of the nanoparticle 25, as well as the characteristics of the nanoparticle 25 itself.

Figure 7A:
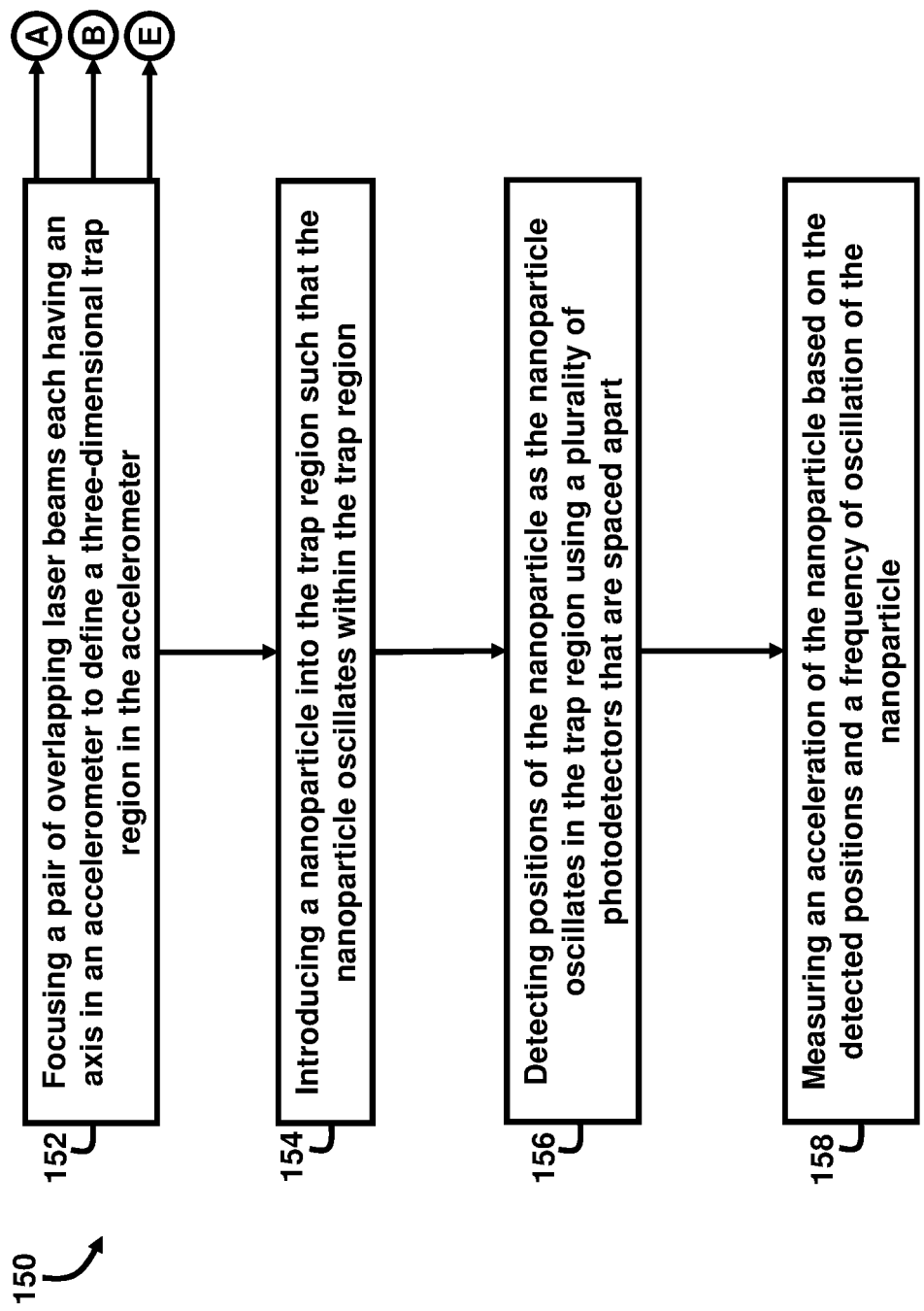
FIG. 7A is a flow diagram illustrating a method of measuring an acceleration of a nanoparticle, according to an embodiment herein.
Figure 7D:
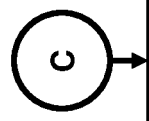
FIG. 7D is a flow diagram illustrating a method of tuning the confinement of a nanoparticle in a trap region of an accelerometer, according to an embodiment herein.

FIG. 7A, with reference to FIGS. 1 through 6, illustrates a method 150 of measuring an acceleration of a nanoparticle 25. The method 150 comprises focusing (152) a pair of overlapping laser beams 20a, 20b each having an axis 28a, 28b in an accelerometer 10 to define a three-dimensional trap region 100 in the accelerometer 10. In an example, the pair of overlapping laser beams 20a, 20b may comprise any suitable wavelength of light such as 532 nm, 1064 nm, and 1550 nm, although other suitable wavelengths may be utilized in accordance with the embodiments herein. Furthermore, the nanoparticle 25 may comprise any suitable material and size as described above.

Next, the method 150 comprises introducing (154) a nanoparticle 25 into the trap region 100 such that the nanoparticle 25 oscillates within the trap region 100. The nanoparticle 25 may be introduced using any suitable technique. According to the embodiments therein, the nanoparticle 25 may comprise a speed that has to be controlled to ensure the nanoparticle 25 remains in an oscillated and levitated state in the trap region 100 of the vacuum chamber 15. The method 150 further comprises detecting (156) positions of the nanoparticle 25 as the nanoparticle 25 oscillates in the trap region 100 using a plurality of photodetectors 40x that are spaced apart. The embodiments herein are not restricted to any particular type of detecting (156) process so long as the positions of the nanoparticle 25 can be accurately measured. For example, image processing techniques performed by the processor 35 in conjunction with a plurality of photodetectors 40 may be utilized for the detecting (156) process. Thereafter, the method 150 comprises measuring (158) an acceleration of the nanoparticle 25 based on the detected positions and a frequency @ of oscillation of the nanoparticle 25. The processor 35 may be used to calculate the measuring (158) process in real-time and a feedback mechanism such as modulator 80, may be utilized to change the intensity of the laser beams 20a, 20b to ensure proper positioning of the nanoparticle 25 in the trap region 100 of the vacuum chamber 15.

As such, it may be challenging to control the nanoparticle 25 in order to have the nanoparticle 25 enter the vacuum chamber 15 and be retained in the vacuum chamber 15. Accordingly, the method 150 may increase the strength of the trap region 100 by increasing the electric field density $E_1$ in the trap region 100 to be greater than the electric field density $E_2$ in areas 105 outside of the trap region 100 in the vacuum chamber 15. This may be accomplished by modulating the strength of the laser beams 20a, 20b; e.g., using modulator 80, such that the laser beams 20a, 20b begin as being relatively weak in strength or intensity and then quickly increases in strength or intensity.

The mechanism of optical trapping described herein works with focused laser light 70 of any wavelength λ and any nanoparticle 25 that has no dimension larger than that wavelength λ. The fact that the nanoparticle 25 is trapped in the trap region 100 by virtue of its polarizability, and the fact that all matter has non-zero polarizability indicates that any suitable material could be used for the nanoparticle 25. In this regard, and as described above, the embodiments herein are not restricted to any particular shape and/or configuration of the nanoparticle 25. Moreover, the choice of material for the nanoparticle 25 may affect the sensitivity and dynamic range available to the accelerometer 10 and/or system 50. In some examples, higher power and more silicon-like nanoparticles 25 with lower wavelengths λ may yield a better dynamic range for a particular target oscillation frequency ω. Additionally, the power of the laser beams 20a, 20b and the width of the overlapping foci 30 of the laser beams 20a, 20b can be tuned during operation to optimize the properties of the accelerometer 10 and/or system 50 to the particular operational environment.

FIGS. 7B through 7G illustrate several other aspects of the method 150. For example, as provided in FIG. 7B, the method 150 may comprise selectively adjusting (160) a precision and dynamic range of the accelerometer 10 in real-time during operation of the accelerometer 10. As provided in FIG. 7C, the method 150 may comprise adjusting (162) a power of the overlapping pair of laser beams 20a, 20b. As provided in FIG. 7D, the method 150 may comprise increasing (164) the power of the pair of laser beams 20a, 20b to increase an electric field density in the foci 30 of the overlapping pair of laser beams 20a, 20b in the trap region 100 to increase a confinement of the nanoparticle 25 in the trap region 100.

Figure 7E:
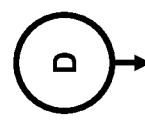
FIG. 7E is a flow diagram illustrating a method of increasing the sensitivity of an accelerometer, according to an embodiment herein.
Figure 7F:
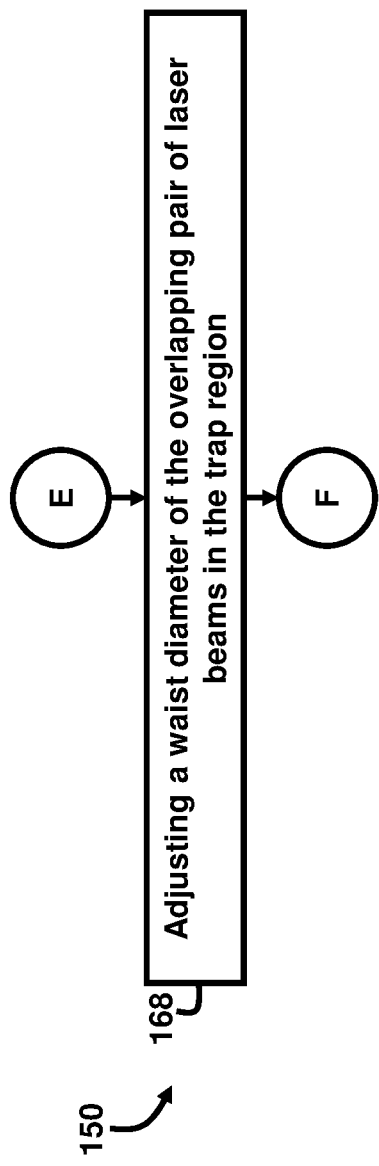
FIG. 7F is a flow diagram illustrating another method of controlling a pair of laser beams, according to an embodiment herein.
Figure 7G:
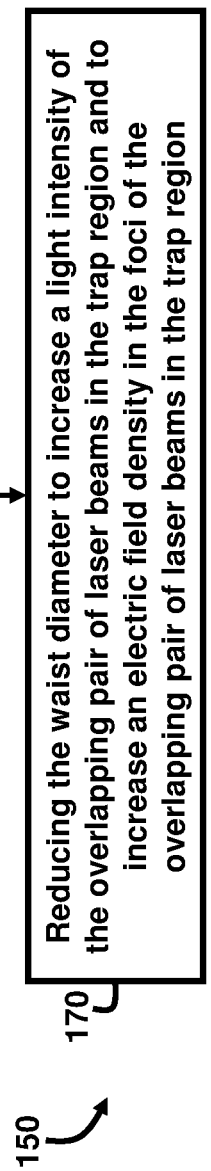
FIG. 7G is a flow diagram illustrating a method of increasing the light intensity and electric field density in an accelerometer, according to an embodiment herein.

As provided in FIG. 7E, the method 150 may comprise reducing (166) the power of the pair of laser beams 20a, 20b to increase sensitivity of the accelerometer 10 to measure accelerations of the nanoparticle 25. As provided in FIG. 7F, the method 150 may comprise adjusting (168) a waist diameter of the overlapping pair of laser beams 20a, 20b in the trap region 100. As provided in FIG. 7G, the method 150 may comprise reducing (170) the waist diameter to increase a light intensity of the overlapping pair of laser beams 20a, 20b in the trap region 100 and to increase an electric field density in the foci 30 of the overlapping pair of laser beams 20a, 20b in the trap region 100. Moreover, the measuring (158) of the acceleration of the nanoparticle 25 based on the detected positions and the frequency of oscillation may comprise measuring (172) a center of the nanoparticle 25 with respect to a center of the trap region 100.

According to the method 150, the power and waist diameter of the laser beams 20a, 20b can be adjusted during operation in order to change the precision and dynamic range of the device in real-time. When the power is increased, the electric field density at the foci is increased, which traps the nanoparticle 25 more tightly (k increases). This tighter confinement increases allows the nanoparticle 25 to be held in the trap region 100 in the presence of higher accelerations, increasing the dynamic range, but reduces the extent to which the nanoparticle 25 is displaced by accelerations, reducing the precision of acceleration measurements. Conversely, reducing the laser power decreases the dynamic range and increases the sensitivity. Similarly, reducing the waist diameter also increases the laser light intensity and therefore the electric field density at the overlapping foci 30, making it so that smaller waist diameters increase dynamic range and decrease precision and larger waist diameters decrease dynamic range and increase precision. Additionally, reducing or decreasing the waist diameter and therefore increasing the electric field density increases the confinement of the nanoparticle 25 in the trap region 100. Moreover, increasing the waist diameter increases the sensitivity of the accelerometer 10 and/or system 50 to measure accelerations. Furthermore, because the precision and dynamic range have different dependencies on laser power and waist diameter, specific combinations of dynamic range and precision can by "dialed" in by adjusting power and waist diameter appropriately. This allows the accelerometer 10 and/or system 50 on a dynamic platform to be continually optimized in real-time to suit the current operating environment.

The potential seen by the nanoparticle 25 will look quadratic near the center of the trap region 100 even though it is not quadratic everywhere. It may be desired to know the portion of the trap region 100 for which it is reasonable to approximate that the potential is quadratic. A "looser trap" is preferred because $S_{\vec{a}} = \omega^2 S_{\vec{x}_0}$. The trap region 100 can be made looser either by widening the overlapping foci 30 of the laser beams 20a, 20b or by reducing the power, strength, or intensity of the laser beams 20a, 20b. If the trap region 100 is too weak and the acceleration is too strong, the nanoparticle 25 may be pulled into inharmonic regions of the trap region 100 or pulled out of the trap region 100 entirely.

There may be restrictions on how far the nanoparticle 25 may be pulled from the center of the trap region 100. Ideally, one could just make the overlapping foci 30 of the laser beams 20a, 20b very wide and the power of the laser beams 20a, 20b very large to have a low frequency but deep trap region 100. However, power of the laser beams 20a, 20b may be limited by what is available and by what could (or could not) melt the nanoparticle 25. Neither the sensitivity nor the dynamic range are affected directly by the mass or volume of the nanoparticle 25. Taking a non-limiting example, if the nanoparticle 25 is configured as a single atom in the trap region 100, it should oscillate at some frequency, and if the nanoparticle 25 comprises two atoms mostly co-located in the trap region 100, they should also oscillate at the frequency. Furthermore, binding those atoms together should not cause them to behave any differently. Moreover, this concept may extend all the way to larger (but still sub-wavelength) nanoparticles 25.

The embodiments herein provide an optically levitated nanoparticle accelerometer 10, system 50, and method 150 of measuring the acceleration of a nanoparticle 25; e.g., using an optically trapped nanoparticle 25 to measure a force (e.g., gravitational, inertial, etc.) by measuring displacements of the center of oscillation of the nanoparticle 25. A pair of collinear laser beams 20a, 20b are focused to a point in space (e.g., trap region 100) in a vacuum chamber 15. A sub-wavelength-sized nanoparticle 25 is held in the center of the overlapping foci 30 of the laser beams 20a, 20b by virtue of its polarizability. The nanoparticle 25 scatters light 60 which is then used to track the position of the nanoparticle 25. In an example, the intensity of the laser beams 20a, 20b, and therefore the strength of the trap region 100, is modulated so that the trap region 100 is always looser as the nanoparticle moves toward its center of oscillation. Thus, the kinetic and potential energy of the nanoparticle 25 is reduced. Moreover, the inertial or gravitational acceleration causes the center of oscillation of the nanoparticle 25 to be displaced from the center of the optical trap region 100 by an amount proportional to that acceleration.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Those skilled in the art will recognize that the embodiments herein can be practiced with modification within the spirit and scope of the appended claims.

What is claimed is:

1. An accelerometer comprising:
a vacuum chamber to receive one or more pairs of laser beams and a nanoparticle, wherein each laser beam comprises an axis and a focus having three dimensions, wherein the nanoparticle is trapped in an oscillating state in a substantially overlapping three-dimensional foci of the one or more pairs of laser beams, wherein the nanoparticle comprises a diameter of less than 100 nm and is trapped in the focus of the laser beam based on a polarizability of the nanoparticle, and wherein the substantially overlapping foci comprise a trap region having a first electric field density $E_1$ provided by a first laser greater than a second electric field density $E_2$ in areas outside the trap region;
a processor to calculate an acceleration of the nanoparticle based on changes in position of the oscillating nanoparticle; and
at least one photodetector to identify spatial coordinates of the oscillating nanoparticle.

2. The accelerometer of claim 1, wherein the at least one photodetector comprises a plurality of photodetectors that are aligned to sense interference between light from a first laser beam and light from the first laser beam that is scattered by the oscillating nanoparticle.

3. The accelerometer of claim 1, wherein the one or more pairs of laser beams are collinear.

4. The accelerometer of claim 1, wherein the one or more pairs of laser beams are configured to point at each other.

5. The accelerometer of claim 1, wherein the diameter of the nanoparticle is smaller than a wavelength of the laser beam.

6. The accelerometer of claim 1, wherein the one or more pairs of laser beams comprise substantially similar power levels and waist diameters.

7. The accelerometer of claim 1, wherein a net radiation pressure force on the oscillating nanoparticle does not exceed a net trapping force applied to the oscillating nanoparticle.

8. A system comprising:
a plurality of laser sources to generate a plurality of laser beams;
a vacuum chamber comprising a levitating nanoparticle oscillating in overlapping foci of the plurality of laser beams, wherein the nanoparticle scatters light, wherein the nanoparticle comprises a diameter of less than 100 nm and is trapped in a focus of a laser beam based on a polarizability of the nanoparticle, and wherein the overlapping foci comprise a trap region having a first electric field density $E_1$ provided by a first laser greater than a second electric field density $E_2$ in areas outside the trap region;
at least one sensor to detect a position of the nanoparticle by sensing an interference between light from the laser beam and the light scattered by the nanoparticle; and
a processor to determine an acceleration of the nanoparticle based on a displacement in the position of the nanoparticle and a frequency of oscillation of the nanoparticle while the nanoparticle is oscillating in the overlapping foci of the plurality of laser beams.

9. The system of claim 8, wherein the at least one sensor comprises an array of photodiode sensors to monitor the scattered light emitting from the nanoparticle and the light from the laser beam that is not scattered by the nanoparticle, and determine a three-dimensional motion of the nanoparticle while the nanoparticle is oscillating in the overlapping foci of the plurality of laser beams.

10. The system of claim 8, comprising a modulator to control an intensity of the plurality of laser beams.

11. The system of claim 8, wherein the plurality of laser sources are to generate a set of two or more laser beams.

12. The system of claim 8, wherein the diameter of the nanoparticle is smaller than a wavelength of the laser beam.

13. A method of measuring an acceleration of a nanoparticle, the method comprising:
  focusing a pair of overlapping laser beams each having an axis in an accelerometer to define a three-dimensional trap region in the accelerometer;
  introducing a nanoparticle into the trap region such that the nanoparticle oscillates in overlapping foci of the plurality of laser beams within the trap region, wherein the nanoparticle comprises a diameter of less than 100 nm and is trapped in a focus of a laser beam based on a polarizability of the nanoparticle, and wherein the trap region having a first electric field density $E_1$ provided by a first laser greater than a second electric field density $E_2$ in areas outside the trap region;
  detecting positions of the nanoparticle as the nanoparticle oscillates in the trap region using a plurality of photodetectors that are spaced apart; and
  measuring an acceleration of the nanoparticle based on the detected positions and a frequency of oscillation of the nanoparticle.

14. The method of claim 13, comprising selectively adjusting a precision and dynamic range of the accelerometer in real-time during operation of the accelerometer.

15. The method of claim 13, comprising adjusting a power of the overlapping pair of laser beams.

16. The method of claim 15, comprising increasing the power of the pair of laser beams to increase an electric field density in the foci of the overlapping pair of laser beams in the trap region to increase a confinement of the nanoparticle in the trap region.

17. The method of claim 15, comprising reducing the power of the pair of laser beams to increase sensitivity of the accelerometer to measure accelerations of the nanoparticle.

18. The method of claim 13, comprising adjusting a waist diameter of the overlapping pair of laser beams in the trap region.

19. The method of claim 18, comprising reducing the waist diameter to increase a light intensity of the overlapping pair of laser beams in the trap region and to increase an electric field density in the foci of the overlapping pair of laser beams in the trap region.

20. The method of claim 13, wherein the measuring of the acceleration of the nanoparticle based on the detected positions and the frequency of oscillation comprises measuring a center of the nanoparticle with respect to a center of the trap region.

* * * * *